(12) United States Patent
Lu et al.

(10) Patent No.: US 6,740,594 B2
(45) Date of Patent: May 25, 2004

(54) METHOD FOR REMOVING CARBON-CONTAINING POLYSILANE FROM A SEMICONDUCTOR WITHOUT STRIPPING

(75) Inventors: Zhijian Lu, Poughkeepsie, NY (US); Oliver Genz, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/867,518

(22) Filed: May 31, 2001

(65) Prior Publication Data

US 2002/0182871 A1 Dec. 5, 2002

(51) Int. Cl.[7] ............................................. H01L 21/311
(52) U.S. Cl. ........................ 438/703; 438/706; 438/707
(58) Field of Search ................................. 438/703, 704, 438/706, 707, 733

(56) References Cited

U.S. PATENT DOCUMENTS

| 4,789,427 | A | 12/1988 | Fujimura et al. ............ 156/643 |
| 5,310,703 | A | 5/1994 | Visser et al. ................. 437/229 |
| 5,773,201 | A | 6/1998 | Fujimura et al. ........... 430/329 |
| 5,811,358 | A | 9/1998 | Tseng et al. ................. 438/725 |
| 5,824,604 | A | 10/1998 | Bar-Gadda ................... 438/725 |
| 5,882,535 | A | * 3/1999 | Stocks et al. ................. 216/18 |
| 6,030,901 | A | 2/2000 | Hopper et al. |
| 6,074,569 | A | 6/2000 | Kiziloglu et al. |
| 6,105,588 | A | 8/2000 | Li et al. |
| 6,110,651 | A | 8/2000 | Fukushima et al. |
| 6,133,128 | A | 10/2000 | Das et al. |
| 6,270,948 | B1 | 8/2001 | Sato et al. |

FOREIGN PATENT DOCUMENTS

| EP | 1087433 A1 | 3/2001 |
| JP | 60-262425 | 12/1985 |
| JP | 10-189532 | 7/1998 |
| JP | 2000-260870 | 9/2000 |

* cited by examiner

*Primary Examiner*—Richard Elms
*Assistant Examiner*—Beth E. Owens

(57) ABSTRACT

A method for removing a carbon-containing polysilane from a semiconductor substrate without stripping the polysilane during manufacture of a semiconductor device, the method entailing the steps in the following order of coating a carbon-containing polysilane on a semiconductor substrate and coating a resist on the polysilane; patterning the resist with exposure and development; transferring the pattern from the resist to the polysilane using an etch process selective to the resist; stripping the resist; transferring the pattern from the polysilane to a hardmask using an etch selective to the hardmask; subjecting the polysilane to thermal or plasma/thermal oxidation to convert the polysilane to silicon oxide; and etching the substrate and stripping off the hardmask.

13 Claims, 7 Drawing Sheets

METHOD FOR REMOVING CARBON-CONTAINING POLYSILANE FROM A SEMICONDUCTOR WITHOUT STRIPPING

BACKGROUND OF THE INVENTION

1. Field of the Invention

The present invention relates to the use of thermal oxidation or a combination of thermal and plasma oxidation to convert carbon-containing polysilane to silicon oxide to avoid the need to strip polysilane and to allow introduction of an additional oxide layer as a mask layer for substrate etching, when manufacturing semiconductor products or devices.

2. Description of the Prior Art

In general, removal of a photoresist is accomplished by a chemical process that is a wet process, or one using an "after glow" of plasma, ozone, and the like. For instance, the wet process may be completed by using a solution of an acid, an alkali, or an organic solvent.

However, it is well known that a photoresist cannot be completely removed by a chemical process. In the case of an ion implantation process, the resist develops in a manner so as to be carbonized to a significant extent. Further, the surface of the resist is damaged in the etching process if fluorine gas or fluoride is used. As a result, the carbonized or damaged portion formed during the ion implantation or fluorine etching processes is not completely removed, and remains after the resist removal process is completed.

Due to the encumbrances of the chemical removal methods, a dry resist removal process or ashing method has been utilized in which a plasma removal method using gas having a high oxygen content is employed. In the plasma removal method, gas is brought to a plasma state by applying a high frequency electric field to generate a multiplicity of charged particles such as radicals, electrons and ions, and removing the resist by utilizing a chemical reaction between the generated charged particles and the constituent atoms or molecules of the resist.

Nevertheless, the plasma stripping process is also characterized by short comings in that: the total stripping time is longer; the longer stripping time limits the production rate and increases the cost of production per wafer; and the high temperatures involved in the process can cause the photoresist to bubble. Bubbling is caused by either solvent trapped in the photoresist layer during the step of "fixing" in which the photoresist boils, thereby creating a gaseous high-pressure pocket in the photoresist that breaks the photoresist to permit the gas to form in different parts of the wafer and thereby damage or contaminate other parts of the wafer, or by implanted metal species that form volatile species which are trapped below the hardened crust during photoresist stripping.

U.S. Pat. No. 5,773,201 disclose a down stream ashing method for removing organic resist film from a semiconductor wafer in which water vapor is added to an oxygen gas as a reaction gas. The amount of added water vapor is more than 1% of the total reaction gas with respect to the flow rate. The process entails:

placing a semiconductor wafer having an organic resist film thereon in a reaction chamber;

creating a gas plasma containing both electrically neutral species and charged particles by subjecting a gas containing oxygen to electromagnetic power;

ashing the organic resist film on the semiconductor wafer by exposing the wafer with the film thereon to the neutral species while shielding the wafer from the charged particles; and reducing an activation energy of the ashing reaction between the organic resist film and the neutral species, thereby reducing the temperature necessary to drive the ashing reaction at a predetermined given rate, by causing the gas containing oxygen to also contain a water vapor.

A process for removing hardened or implanted photoresist from a silicon wafer is disclosed in U.S. Pat. No. 5,824,604. The process comprises:

a. placing a silicon wafer having hardened or implanted photoresist and oxide thereon into a wafer processing chamber of a plasma-generating reactor;

b. forming reactive species by generating a plasma of a gas comprising oxygen, a halogen-containing compound, and a hydrocarbon under conditions capable of causing undesired etching of the oxide in the absence of the hydrocarbon, wherein the reactive species include ions formed from the hydrocarbon;

c. exposing the surface of the silicon wafer to reactive species from the plasma, including at least some of the ions formed from the hydrocarbon; and d. maintaining the flow of the hydrocarbon such that the selectivity of etching of the photoresist relative to the oxide is substantially increased over the selectivity that would exist in the absence of the hydrocarbon.

U.S. Pat. No. 4,789,427 disclose a method for removing a resist of a semiconductor device comprising:

removing the resist on a layer formed on a semiconductor substrate having a functional region, any direction of the thickness thereof by a predetermined thickness by applying plasma processing; and removing the remaining resist by applying a chemical process.

A low temperature dry process for stripping photoresist after high dose ion implantation is disclosed in U.S. Pat. No. 5,811,358. The process comprises:

providing semiconductor device structures on a semiconductor substrate;

forming a photoresist layer as ion-implantation mask on the semiconductor substrate;

performing high dose ion implantation into the semiconductor substrate while hardening a surface of the photoresist mask to form a mask with a hardened surface and a subsurface;

first plasma-etching the implant-hardened surface of the photoresist layer, wherein the first plasma-etching includes oxygen and nitrogen/hydrogen plasmas;

second plasma-etching the subsurface of the photoresist layer, wherein the second plasma-etching includes oxygen and nitrogen/hydrogen plasmas and takes place at a higher temperature than the first plasma-etching;

third plasma-etching any residual oxide on the photoresist layer, wherein the third plasma-etching includes nitrogen/hydrogen plasmas; and cleaning said semiconductor substrate.

U.S. Pat. No. 5,310,703 disclose a method of manufacturing a semiconductor in which photoresist on a silicon oxide layer on a semiconductor substrate is stripped using an oxygen plasma afterglow and a biased substrate. The process entails:

(a) connecting a first electrode to another surface of the semiconductor substrate, the first electrode being connected to a positive terminal of an electrical source, (b) arranging a second electrode in the processing chamber at a distance from the photoresist, the second electrode being connected to a negative terminal of the electrical source, (c) applying at least a direct current electrical voltage between the first and second electrodes, (d) stripping the photoresist from the layer of silicon oxide by placing the photoresist in an afterglow of an oxygen plasma, and (e) maintaining an electric field of said electrical voltage between the layer of silicon oxide and the plasma with the first and second electrodes in order to reduce contamination of the layer of silicon oxide by decelerating ions of the plasma.

In the manufacture of semiconductor devices, both organic and inorganic bottom anti-reflective coatings (ARCs) are extensively used to suppress variation of critical dimension (CD). Also, because of etch considerations associated with aggressively shrinking resist thickness and poor etch resistance at 193 nm resists, the industry has begun using anti-reflective coatings for both CD control and as an etch hard mask. Accordingly, there is a need in the art of manufacturing semiconductor devices to employ or find a material which can function as a good ARC material; exhibit strong absorption characteristics at 193 nm and 248 nm wavelengths; be characterized by a high etch selectivity to resist oxide and nitride; and perform as an acceptable hard mask for substrate etching.

SUMMARY OF THE INVENTION

One object of the present invention is to provide a method for removing polysilane without stripping during manufacturing of a semiconductor device without incurring the disadvantages of existing wet agents.

Another object of the present invention is to provide a method for removing polysilane without stripping during manufacture of a semiconductor device, in which polysilane is used as an antireflective coating (ARC) material, without incurring the disadvantages of existing wet agents.

A further object of the present invention is to provide an additional mask layer for substrate etching during the manufacturing of a semiconductor device by converting polysilane to silica.

DESCRIPTION OF PREFERRED EMBODIMENT OF THE INVENTION

In general, the invention process provides a solution to polysilane stripping in the course of preparing a semiconductor and is an alternative to well known processes using wet agents for stripping polysilane that are not satisfactory when the polysilane is used as an anti-reflective coating (ARC) in semiconductor devices. The invention process provides an additional mask layer for substrate etching by converting polysilane to silica. By using thermal oxidation or a combination of thermal and plasma oxidation to convert carbon-containing polysilane into pure silicon oxide, the necessity of stripping the polysilane is avoided, by introducing an additional oxide layer as a mask layer for a substrate etching. The general process flow may be described as follows:

coating a polysilane and a photoresist onto a substrate;

patterning the resist with exposure and development using photolithography;

transferring the pattern from the resist to the polysilane using an etch process that is selective to resist;

stripping the resist;

transferring the pattern from the polysilane to a hard mask using an etch process that is selective to hard mask;

subjecting the polysilane layer to thermal or thermal/plasma oxidation to convert the polysilane to silica;

etching the substrate; and stripping off all of the hard mask.

Figure 1:
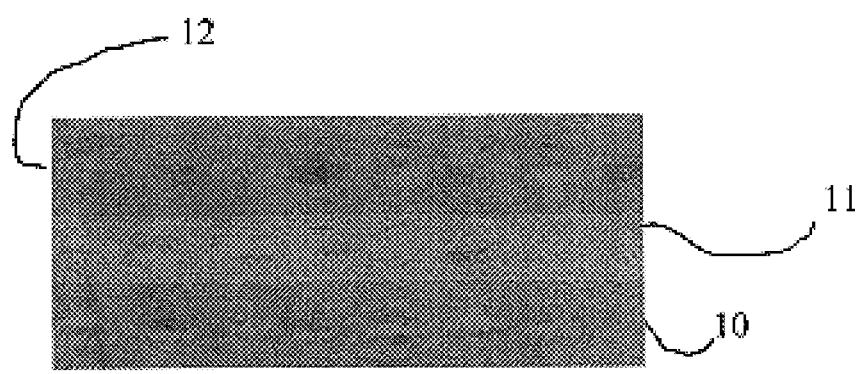
FIG. 1 depicts a semiconductor substrate on which there is coated a polysilane and a photoresist.

Reference is now made to FIG. 1 which shows a substrate 10 coated with a polysilane 11 and a photoresist 12.

Figure 2:
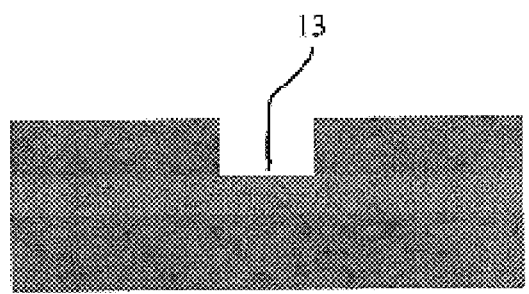
FIG. 2 shows the semiconductor of FIG. 1 after patterning of the resist with exposure and development, as for example, with photolithography.
Figure 3:
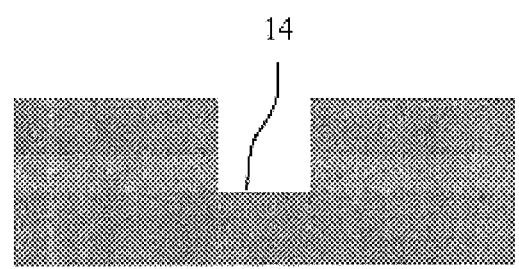
FIG. 3 shows transferring the pattern from the resist to the polysilane using an etch process selective to the resist.

By subjecting the structure of FIG. 1 to exposure and development, the resist coat is patterned as shown in reference numeral 13. Typically, photolithography, which is well-known in the art is utilized to pattern the resist with exposure and development. The pattern 13 from the resist 12 of FIG. 2 is transferred to the polysilane 11, and is designated by reference numeral 14, as shown in FIG. 3. Transferring the pattern from the resist to the polysilane as shown in FIG. 3 is accomplished using an etch process that is selective to the resist.

Figure 4:
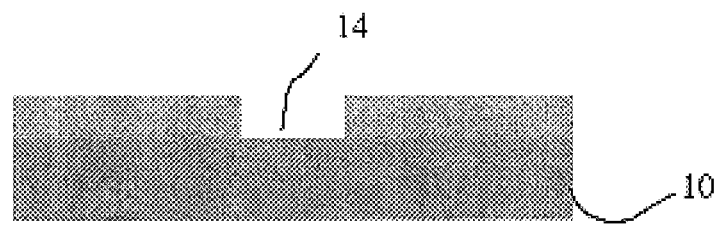
FIG. 4 shows the step of stripping the resist.
Figure 5:
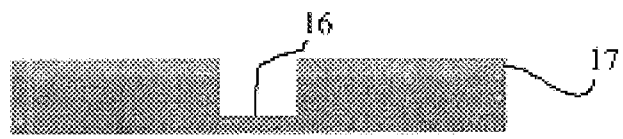
FIG. 5 shows the steps of transferring the pattern from the polysilane to a hard mask using an etch process selective to the hard mask.
Figure 6:
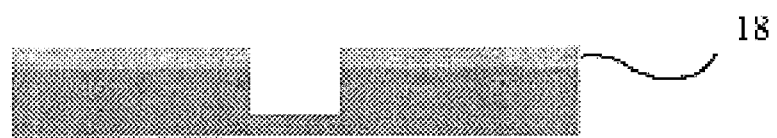
FIG. 6 shows the steps of subjecting the wafer to thermal or plasma/thermal oxidation to convert the polysilane to silica.

Resist 12 is stripped as shown in FIG. 4, thereby leaving substrate 10 with polysilane that is patterned 14. Next, the pattern from the polysilane is transferred to a hard mask using an etch process that is selective to the hard mask on the substrate as shown in FIG. 5, and designated as reference numeral 16. The remaining polysilane layer 17 of FIG. 5 is subjected to either thermal or plasma/thermal oxidation to convert the polysilane layer 17 to silica or silicon oxide 18, as shown in FIG. 6. The temperature range during the thermal or plasma/thermal oxidation may range from about 200° C. to about 1,000° C. While not wishing to be bound by a theory as to precisely how the thermal or plasma/thermal oxidation works, it is nevertheless believed that the use of $O_2$ plasma helps in reducing the temperature applied during the plasma/thermal oxidation step.

Figure 7:
FIG. 7 shows the step of etching the substrate and stripping off all of the hard mask, which can be in the form of an oxide.

The thermal or plasma/thermal oxidation step to convert the polysilane to silica is followed by etching the substrate and stripping all hard masks off to arrive at the structure 19, as shown in FIG. 7.

In the context of the invention, any polysilane may be used in the initial coating step, as long as the polysilane has Si—Si bonds in their backbone. Further, thin film coating methods useful for coating the polysilane may be spin coating, dipping, casting, vacuum evaporation and Langmuir-Blodgett methods. Especially preferred is a spin coating method for applying a polysilane solution to a substrate at a high speed of substrate rotation.

Solvents in which the polysilane may be dissolved prior to coating includes aromatic hydrocarbons such as benzene, toluene, and xylene, as well as ether solvents such as tetrahydrofuran (THF) and dibutyl ether. Preferably, the polysilane solution will have a concentration of from about 1 to about 20% by weight so as to enable the polysilane film or coating to have a thickness of from about 0.1 to about 1000 μm.

The preferred polysilanes may be those in accordance with the following formula:

wherein $R^1$ and $R^2$, may be the same or different, are substituted or unsubstituted monovalent hydrocarbon groups, X is a substituted or unsubstituted monovalent hydrocarbon group, alkoxy group or halogen atom, letters m, n and p are numbers satisfying $1 \leq m+n+p \leq 2.2$ and q is an integer of from 10 to 100,000.

When $R^1$ and $R^2$ are aliphatic or alicyclic hydrocarbon groups, the number of carbon atoms is preferably 1 to 12, more preferably 1 to 8 When $R^1$ and $R^2$ are aromatic hydrocarbon groups, the number of carbon atoms is preferably 6 to 14, more preferably 6 to 10. Exemplary of $R^1$ and $R^2$ are alkyl groups such as methyl, ethyl, propyl, butyl, hexyl, cyclohexyl, octyl and decyl, cycloalkyl groups such as cyclopentyl and cyclohexyl, aryl groups such as phenyl, tolyl, naphthyl and biphenyl, aralkyl groups such as benzyl and phenylethyl, and substituted hydrocarbon groups where some or all of the hydrogen atoms are replaced by halogen atoms (e.g., fluorine and chlorine), amino groups.

X is a group as defined for $R^1$, or an alkoxy group of 1 to 8 carbon atoms or a halogen atom such as chlorine. Most often, X is a chlorine atom or an alkoxy group such as methoxy and ethoxy because the group X is to prevent separation of the polysilane film from the substrate or to improve the adhesion of the polysilane film to the substrate.

Individual values of m, n, p and q are not so important insofar as the polysilane is soluble in organic solvents and can be coated on a substrate to a uniform thickness of 0.1 to 1,000 μm. Letters m, n and p are numbers satisfying $1 \leq m+n+p \leq 2.2$ and q is an integer of from 10 to 100,000. Preferably m is a number from 0.1 to 1, especially from 0.5 to 1, n is a number from 0.1 to 2, especially from 0.5 to 1.5, and p is a number from 0 to 0.5, especially from 0 to 0.2.

We claim:

1. A method for removing carbon-containing polysilane from a semiconductor substrate without stripping the polysilane during manufacture of a semiconductor device, comprising:

a) coating a carbon-containing polysilane on a semiconductor substrate and coating a resist on said polysilane;

b) patterning said resist with exposure and development;

c) transferring the pattern from said resist to said polysilane using an etch process selective to said resist;

d) stripping said resist;

e) transferring the pattern from said polysilane to a hardmask using an etch selective to said hardmask;

f) subjecting said polysilane to thermal or plasma/thermal oxidation to convert said polysilane to silicon oxide; and g) etching the substrate and stripping off the hardmask.

2. The method of claim 1, wherein in step a) said polysilane is coated by spin coating.

3. The method of claim 1, wherein in step a) said polysilane is coated by dipping.

4. The method of claim 1, wherein in step a) said polysilane is coated by casting.

5. The method of claim 1, wherein in step a) said polysilane is coated by vacuum evaporation.

6. The method of claim 1, wherein in step a) said polysilane is coated by a Langmuir-Blodgett method.

7. The method of claim 2, wherein said polysilane has the formula:

wherein $R^1$ and $R^2$, may be the same or different, are substituted or unsubstituted monovalent hydrocarbon groups, X is a substituted or unsubstituted monovalent hydrocarbon group, alkoxy group or halogen atom, letters m, n and p are numbers satisfying $1 \leq m+n+p \leq 2.2$ and q is an integer of from 10 to 100,000;

when $R^1$ and $R^2$ are aliphatic or alicyclic hydrocarbon groups, the number of carbon atoms is 1 to 12; when $R^1$ and $R^2$ are aromatic hydrocarbon groups, the number of carbon atoms is 6 to 14; and X is a group as defined for $R^1$, or an alkoxy group of 1 to 8 carbon atoms or a halogen atom.

8. The method of claim 7, wherein said polysilane is in a solvent solution containing a polysilane concentration of from about 1 to about 20% by weight.

9. The method of claim 8, wherein said solvent is an aromatic hydrocarbon.

10. The method of claim 9, wherein said aromatic hydrocarbon is selected from the group consisting of benzene, toluene and xylene.

11. The method of claim 8, wherein said solvent is an ether solvent.

12. The method of claim 11, wherein said ether solvent is selected from tetrahydrofuran or dibutyl ether.

13. The method of claim 2, wherein said thermal or plasma thermal oxidation proceeds at a temperature range of from about 200° C. to about 1000° C.

* * * * *